(12) United States Patent
Martin et al.

(10) Patent No.: US 8,574,946 B1
(45) Date of Patent: Nov. 5, 2013

(54) MULTI-ELEMENT PACKAGING OF CONCENTRATOR PHOTOVOLTAIC CELLS

(75) Inventors: Yves C. Martin, Ossining, NY (US); Theodore G. van Kessel, Millbrook, NY (US); Brent A. Wacaser, Garrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/586,182

(22) Filed: Aug. 15, 2012

Related U.S. Application Data

(63) Continuation of application No. 13/561,758, filed on Jul. 30, 2012.

(51) Int. Cl.
*H01L 31/18* (2006.01)

(52) U.S. Cl.
USPC ............................................. 438/66; 438/67

(58) Field of Classification Search
CPC ...................................................... H01L 31/18
See application file for complete search history.

(56) References Cited

U.S. PATENT DOCUMENTS

| | | | |
|---|---|---|---|
| 5,118,361 A | 6/1992 | Fraas et al. | |
| 7,053,294 B2 | 5/2006 | Tuttle et al. | |
| 2009/0000662 A1 | 1/2009 | Harwood et al. | |
| 2010/0050428 A1 | 3/2010 | Becker et al. | |
| 2010/0229936 A1 | 9/2010 | Yago et al. | |
| 2010/0229938 A1 | 9/2010 | Nishino et al. | |
| 2010/0236606 A1 | 9/2010 | Kobayashi et al. | |
| 2010/0243049 A1 | 9/2010 | Leidholm et al. | |
| 2012/0138145 A1* | 6/2012 | Gaynes et al. | 136/259 |

OTHER PUBLICATIONS

O'Neill, M.J. et al., "Development of Terrestrial Concentrator Modules Using High-Efficiency Multi-Junction Solar Cells" Conference Record of the 29th IEEE Photovoltaic Specialists Conference, New Orleans (May 2002) pp. 1369-1372, vol. 19-24.

Araki, K et al., "Development of Concentrator Modules with Dome-shaped Fresnel Lenses and Triple-junction Concentrator Cells" Progress in Photovoltaics: Research and Applications (Aug. 2005) pp. 513-527, vol. 13.

* cited by examiner

*Primary Examiner* — Walter H Swanson
(74) *Attorney, Agent, or Firm* — Scully, Scott, Murphy & Presser, P.C.; Vazken Alexanian

(57) ABSTRACT

A method for forming a photovoltaic structure includes forming a stack, from bottom to top, of a conductive substrate, at least one electrical isolation layer, and a patterned conductive material layer. At least one solar concentrator receiver plate configured to mount a photovoltaic concentrator cells and at least one metallic wiring structure are formed in the patterned conductive material layer. The at least one electrical isolation layer can include a stack of an electrically insulating metal-containing compound layer and an organic or inorganic dielectric material that provides thermal conduction and electrical isolation. The at least one solar concentrator receiver plate can be thicker than the at least one metallic wiring structure so as to provide enhanced thermal spreading and conduction through the at least one electrical isolation layer and into the conductive substrate.

25 Claims, 11 Drawing Sheets

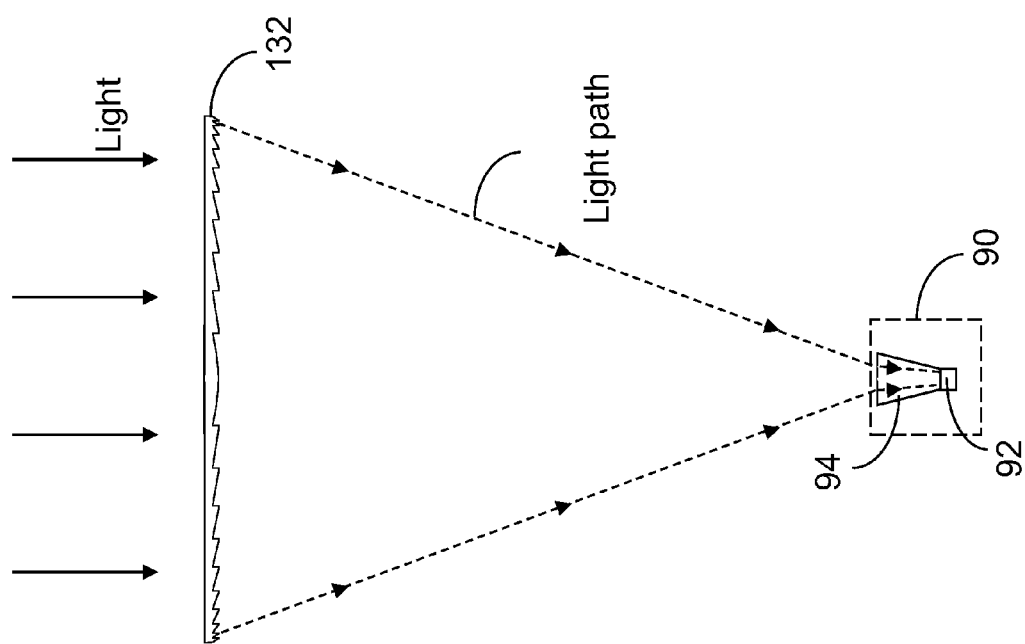

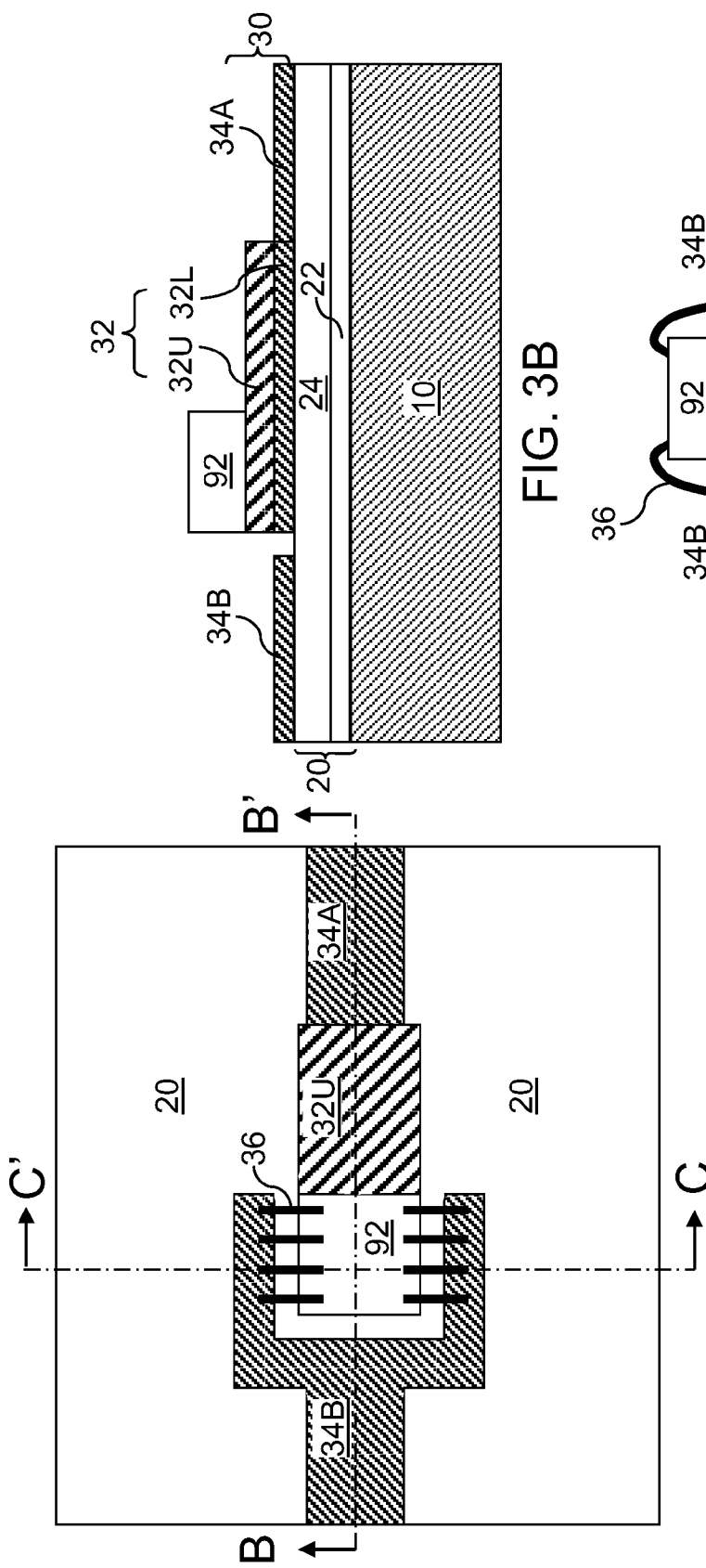

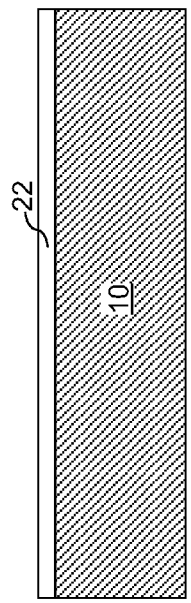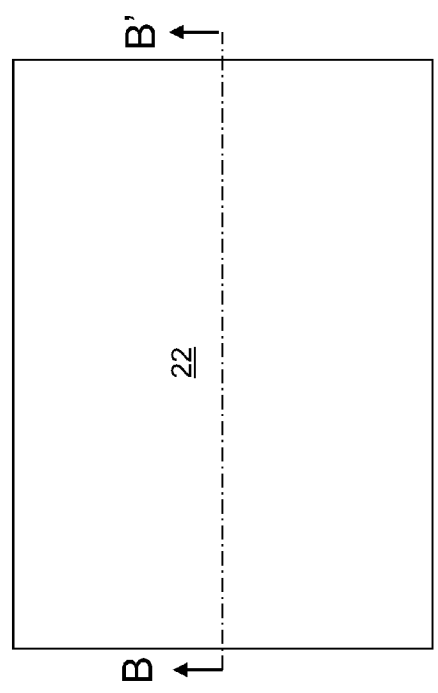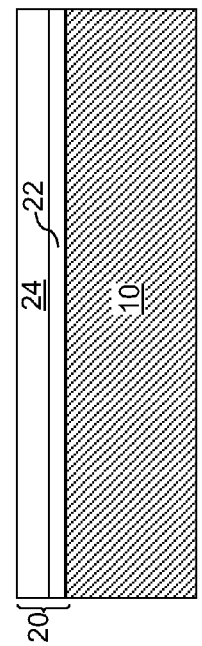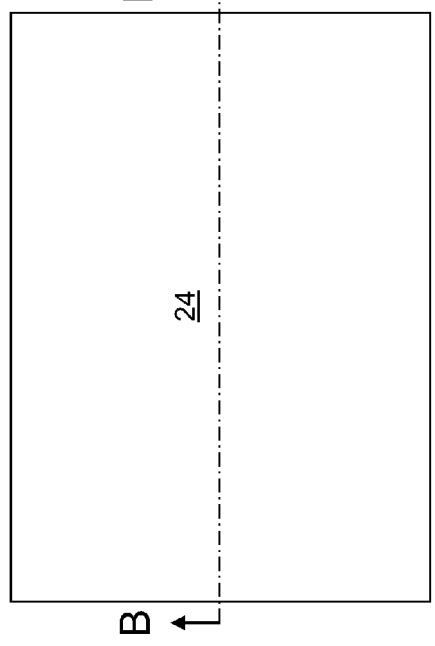

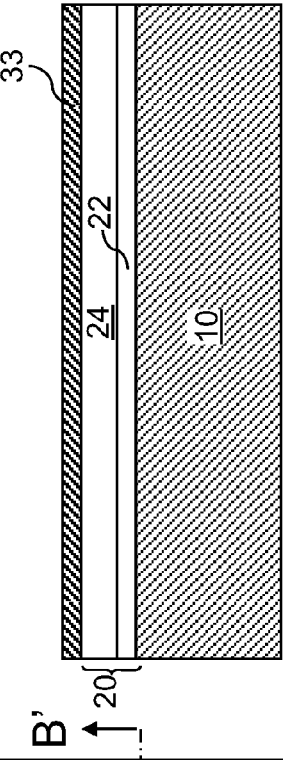
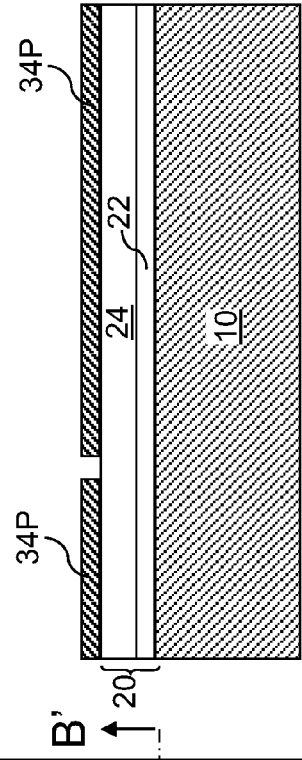
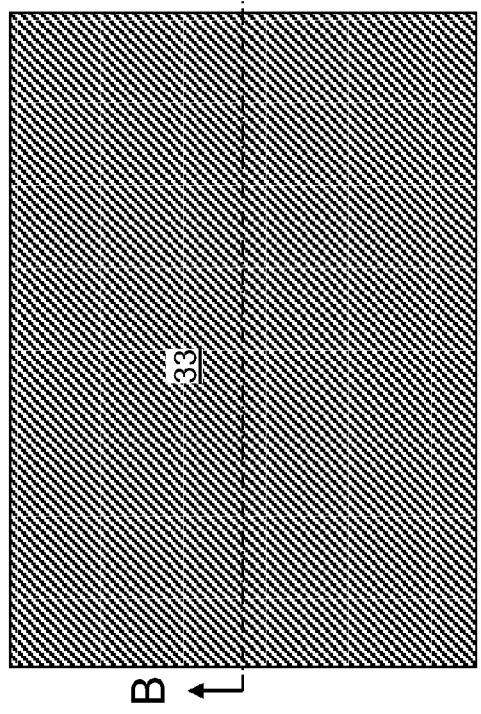
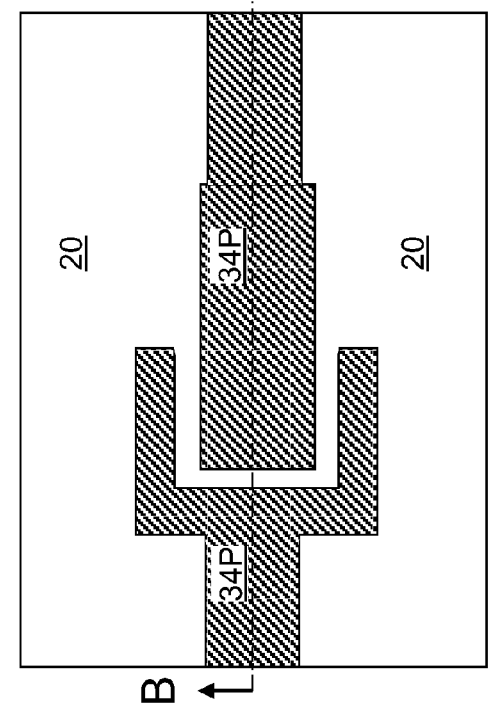

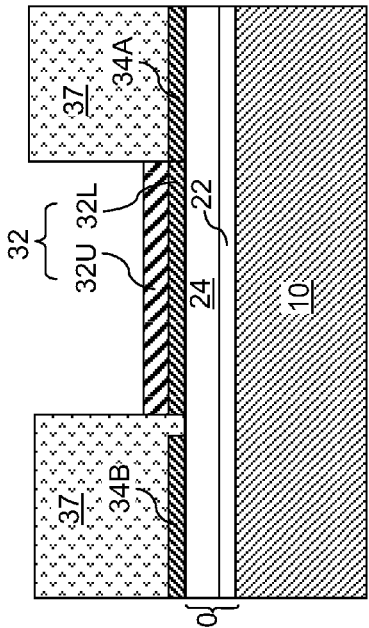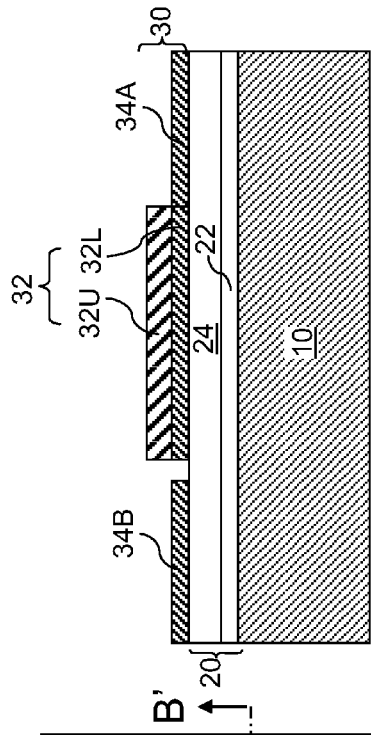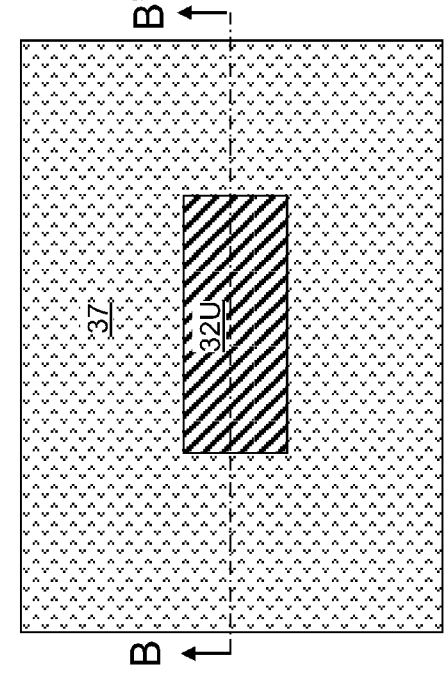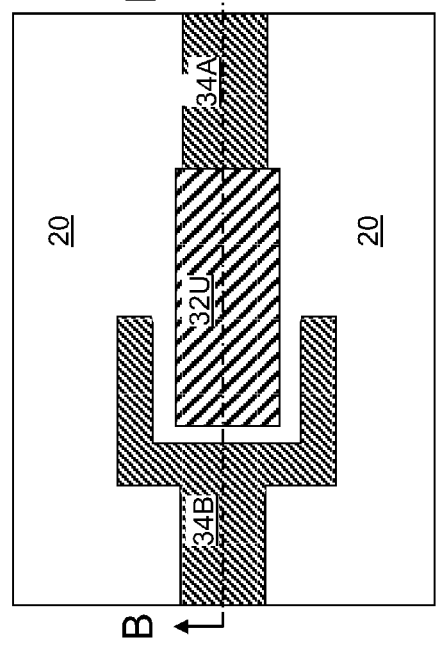

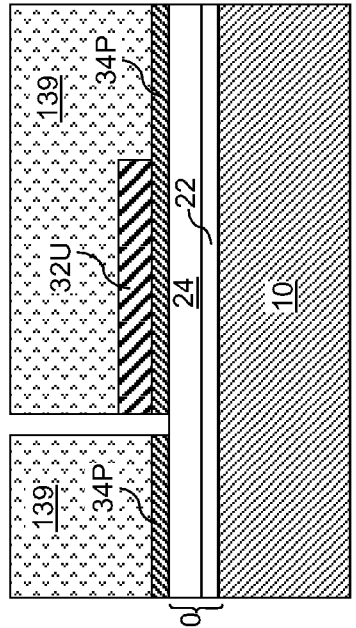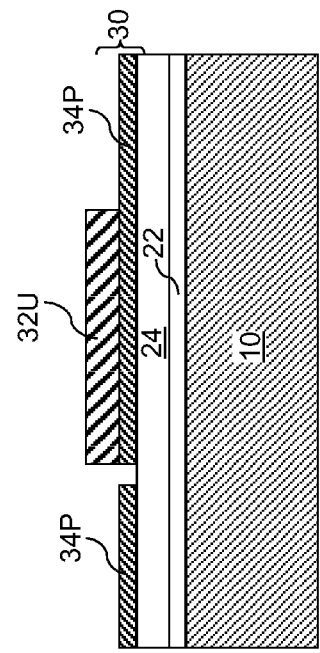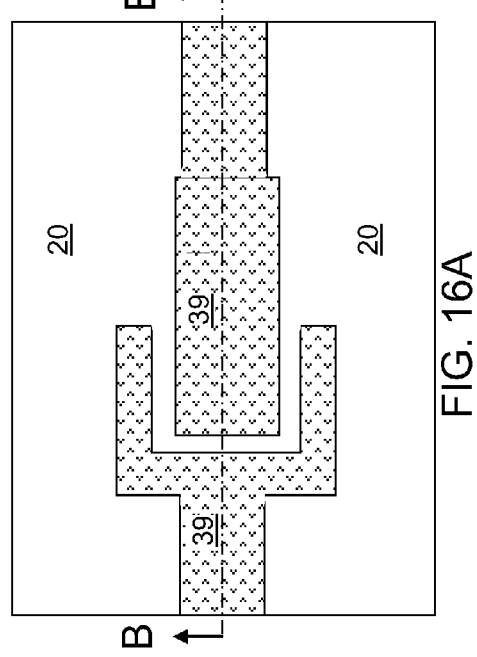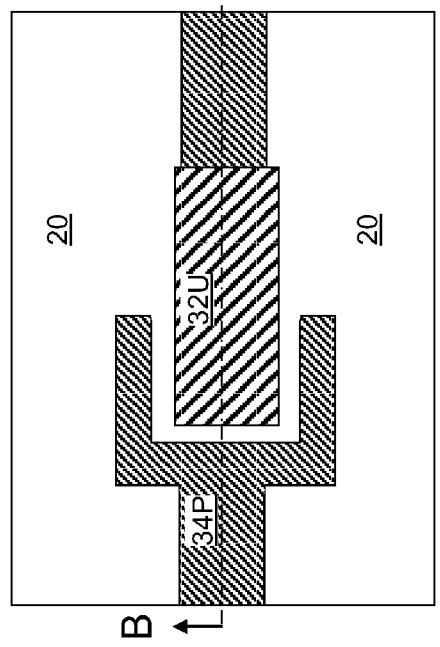

MULTI-ELEMENT PACKAGING OF CONCENTRATOR PHOTOVOLTAIC CELLS

CROSS REFERENCE TO RELATED APPLICATION

This application is a continuation of U.S. patent application Ser. No. 13/561,758, filed Jul. 30, 2012, the entire content and disclosure of which is incorporated herein by reference.

BACKGROUND

The present disclosure relates to packaging structures for photovoltaic cells, and more particularly to packaging structures for photovoltaic cells employing solar concentrators and methods of manufacturing the same.

Solar concentrator systems including multiple refractive or reflective optical elements that concentrate sunlight on multiple spatially separated photovoltaic elements present challenges for electrical connection and cooling as the level of solar concentration increases.

It has been demonstrated that it is possible to operate triple junction photovoltaic concentrator cells above 2000 suns (~200 W/cm$^2$). Operation of concentrator photovoltaic systems at high concentrations is constrained by the ability to cool the photovoltaic elements. Operation of concentrator photovoltaic systems becomes costly and more difficult as the concentration increases, and especially above the areal power density level of 50 W/cm$^2$. As the cell area increases, the use of an auxiliary heat exchange structure becomes necessary above and beyond a simple flat conducting surface and cost goes up. As the cell area decreases the number of connections goes up also increasing the cost.

Photovoltaic elements used for solar concentrators are typically constrained to operation at or below 100° C. for both cell efficiency and lifetime considerations. Lifetime expectations for solar systems are on the order of 20 to 30 years. Operation is desired in desert climates with high isolation where ambient temperatures exceeding 45° C. occur.

The following is a numerical example of the thermal budget for a cooling system operating at an ambient temperature of 40° C. and a chip temperature less than 85° C. In a first photovoltaic system that uses a photovoltaic element having a size of 1 cm$^2$ and a solar concentration of 150 W/cm$^2$, the overall cooling system performance requirement is 0.30° C./W. This combination requires a high performance cooling system with an associated high cost.

In a second photovoltaic system, a photovoltaic element having the size of 5 mm×5 mm is employed with the same level of solar concentration as above. The cooling system performance requirement is 1.2° C./W for the second photovoltaic system. Thus, the second photovoltaic system can be cooled with much less cooling cost than the first photovoltaic system.

As the chip size is reduced, the thermal spreading becomes easier. In the limit heat source approaches a point spreading in 3 dimensions. However, the number of photovoltaic elements and connections are increased by a factor of 4 whenever the lateral dimensions of a photovoltaic element are reduced by a factor of 2. Thus, the cost of providing the photovoltaic elements and connections can increase exponentially with reduction of the size of the photovoltaic elements.

Many solar concentrator systems comprise an array of concentrating Fresnel optical elements comprised of acrylic or silicone on glass material. Light from these concentrating elements is focused on cells mounted on a supporting structure and contained within an enclosure to mechanically support the individual elements and protect them from the environment. As the solar concentration is increased (the area of the photovoltaic surface decreases relative to the light collection optics area), the distance between photovoltaic elements in an array increases. To maintain the cost performance of the cooling system as concentration is increased, the size of the cell may be reduced with the consequence that the number of cell connections increases for a given total power as in the example above.

There are many factors to consider for optimization of high concentration photovoltaic systems. For example, higher concentration reduces the cost for semiconductor material but increases cooling costs. Further, larger die size increases cooling costs, but smaller die size increases the number and cost of electrical connections. Further, it is desirable that the photovoltaic devices are electrically isolated up to approximately 1,700 V for safety and up to several KV for protection from lightening strikes.

BRIEF SUMMARY

A photovoltaic support structure includes, from bottom to top, a thermally conductive substrate, at least one electrical isolation layer, and a patterned conductive material layer. The patterned conductive material layer includes at least one solar concentrator receiver plate configured to mount a photovoltaic concentrator cells and at least one metallic wiring structure. The at least one electrical isolation layer can include a stack of an electrically insulating metal-containing compound layer and an organic or inorganic dielectric material that provides thermal conduction and electrical isolation. In one embodiment, the dielectric material can be chosen to withstand the solder reflow temperature of at least 200° C. The at least one solar concentrator receiver plate can be thicker than the at least one metallic wiring structure so as to provide enhanced thermal spreading and conduction through the at least one electrical isolation layer and into the conductive substrate. In one embodiment, the solar concentrator receiver plate can be configured to allow the solar concentrator cell to be affixed with a solder material.

According to an aspect of the present disclosure, a photovoltaic structure includes a stack, from bottom to top, of a conductive substrate, an electrically insulating metal-containing compound layer, an electrical isolation layer, a patterned conductive material layer, and at least one photovoltaic element. The patterned conductive material layer includes at least one metallic wiring structure having a first thickness and contacting a top surface of the electrical isolation layer and at least one metallic receiver plate having a second thickness that is greater than the first thickness, contacting the top surface of the electrical isolation layer, and contacting a bottom surface of the at least one photovoltaic element.

According to another aspect of the present disclosure, a method of forming a photovoltaic structure is provided. The method includes: forming a stack, from bottom to top, of a conductive substrate and an electrically insulating metal-containing compound layer; forming an electrical isolation layer on a top surface of the electrically insulating metal-containing compound layer; forming a patterned conductive material layer on the electrical isolation layer, wherein the patterned conductive material layer includes at least one metallic wiring structure having a first thickness and contacting a top surface of the electrical isolation layer and at least one metallic receiver plate having a second thickness that is greater than the first thickness and contacting the top surface of the electrical isolation layer; and mounting at least one photovoltaic element on the at least one metallic receiver plate.

BRIEF DESCRIPTION OF SEVERAL VIEWS OF THE DRAWINGS

FIG. 2 is a schematic illustration of the geometry of various elements of the exemplary CPV system of FIGS. 1A and 1B.

FIG. 3A is a top-down view of a first exemplary photovoltaic structure according to a first embodiment of the present disclosure.

FIG. 3B is a vertical cross-sectional view of the first exemplary photovoltaic structure of along the vertical plane B-B' of FIG. 3A.

FIG. 3C is a vertical cross-sectional view of the first exemplary photovoltaic structure of along the vertical plane C-C' of FIG. 3A.

FIG. 6A is a top-down view of an intermediate structure for forming the first, second, or third exemplary photovoltaic structure after formation of an electrically insulating metal-containing compound layer according to an embodiment of the present disclosure.

FIG. 6B is a vertical cross-sectional view of the intermediate structure of FIG. 6A.

FIG. 7A is a top-down view of an intermediate structure for forming the first, second, or third exemplary photovoltaic structure after formation of an electrical isolation layer according to an embodiment of the present disclosure.

FIG. 7B is a vertical cross-sectional view of the intermediate structure of FIG. 7A.

FIG. 8A is a top-down view of an intermediate structure for forming the first, second, or third exemplary photovoltaic structure after formation of a lower conductive material layer according to an embodiment of the present disclosure.

FIG. 8B is a vertical cross-sectional view of the intermediate structure of FIG. 8A.

FIG. 9A is a top-down view of an intermediate structure for forming the first, second, or third exemplary photovoltaic structure after patterning the lower conductive material layer according to an embodiment of the present disclosure.

FIG. 9B is a vertical cross-sectional view of the intermediate structure of FIG. 9A.

FIG. 10A is a top-down view of an intermediate structure for forming the first, second, or third exemplary photovoltaic structure after deposition of an upper conductive material layer according to an embodiment of the present disclosure.

FIG. 10B is a vertical cross-sectional view of the intermediate structure of FIG. 10A.

FIG. 11A is a top-down view of the first exemplary photovoltaic structure after removal of a masking layer according to an embodiment of the present disclosure.

FIG. 11B is a vertical cross-sectional view of the first exemplary photovoltaic structure of FIG. 11A.

FIG. 16A is a top-down view of an intermediate structure for forming the first, second, or third exemplary photovoltaic structure after patterning a lower portion of the blanket conductive material layer according to an embodiment of the present disclosure.

FIG. 16B is a vertical cross-sectional view of the intermediate structure of FIG. 16A.

FIG. 17A is a top-down view of the first exemplary photovoltaic structure after removal of a masking layer according to an embodiment of the present disclosure.

FIG. 17B is a vertical cross-sectional view of the first exemplary photovoltaic structure of FIG. 17A.

DETAILED DESCRIPTION

Figure 1B:
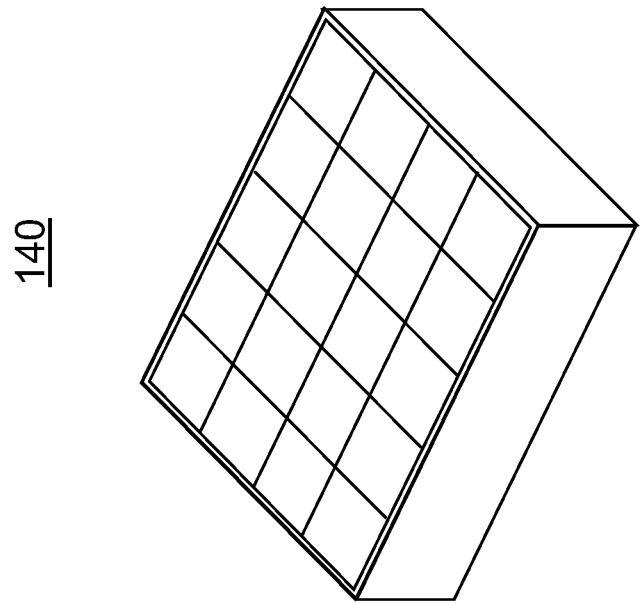
FIG. 1B is an assembly view of the exemplary CPV system according to an embodiment of the present disclosure.

As stated above, the present disclosure relates to packaging structures for photovoltaic cells employing solar concentrators and methods of manufacturing the same, which are now described in further detail with accompanying figures. Throughout the drawings, the same reference numerals or letters are used to designate like or equivalent elements. The drawings are not necessarily drawn to scale.

As used herein, a "photovoltaic structure" is a structure including at least one photovoltaic device.

Figure 1A:
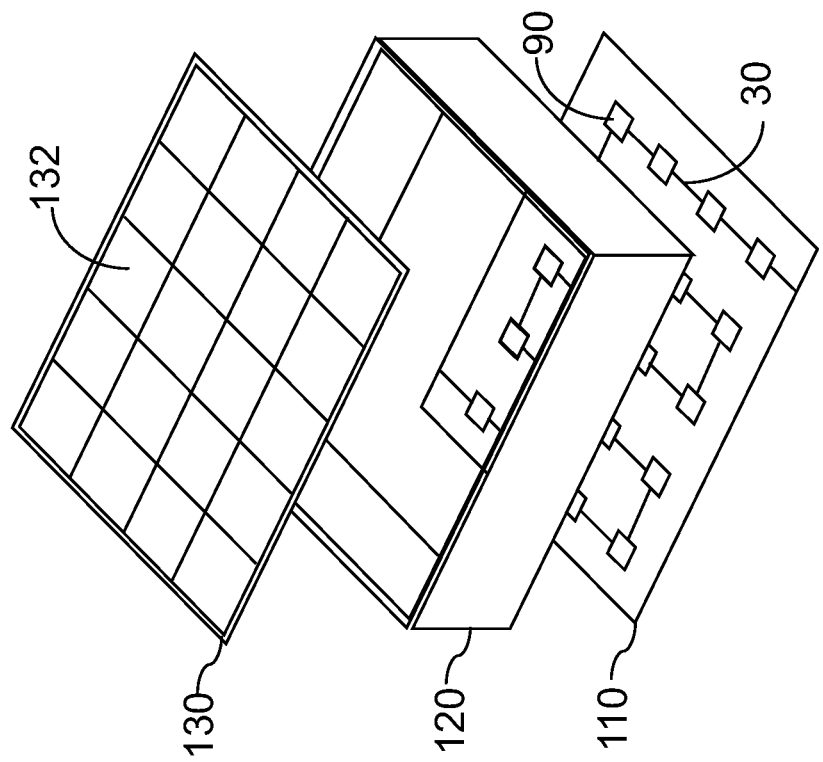
FIG. 1A is a component view of an exemplary Concentrator Photo-Voltaic (CPV) system according to an embodiment of the present disclosure.

Referring to FIGS. 1A and 1B, an exemplary Concentrator Photo-Voltaic (CPV) system according to an embodiment of the present disclosure is schematically illustrated. FIG. 1A illustrates the exemplary CPV system in a component view, in which components of the exemplary CPV system are shown separately. FIG. 1B illustrates the exemplary CPV system in an assembly view, in which the exemplary CPV system is shown as assembled. The geometry of the various elements of the exemplary CPV system as assembled is schematically illustrated in FIG. 2.

The exemplary CPV system includes an array of focusing elements 130, which can be a focusing lens or a focusing minor. In one embodiment, the focusing elements 130 can be an array of Fresnel lenses 132.

The exemplary CPV system further includes an array of photovoltaic assembly 90, which is spaced from the focusing elements 130 approximately by the focal length of the focusing elements 130. The array of photovoltaic assembly 90 can be mounted, for example, on a base plate 110 or any other structure or surface suitable for permanent mounting. As illustrated in FIG. 2, each photovoltaic assembly 90 includes a photovoltaic cell 92 and a light pipe 94 (also referred to as "light prism") interposed between the photovoltaic cell 92 and the corresponding focusing element 130. The light pipe 94 is located in proximity to the front side of the photovoltaic cell 92. The light pipe 94 may, or may not, contact the front surface of the photovoltaic cell 92. The photovoltaic cell 92 can be a multijunction photovoltaic cell including a plurality of photovoltaic junctions at different depths such that the each photovoltaic junction efficiently converts the energy of the wavelength range of the solar radiation focused thereupon.

The array of photovoltaic assembly 90 can be located on a plane that is parallel to the focusing elements 130. The array of photovoltaic assembly 90 can be arranged as a one-dimensional array or a two-dimensional array. Further, the array of photovoltaic assembly 90 can be arranged as a periodic array or in a non-periodic arrangement. Each photovoltaic assembly 90 can be connected to an adjacent photovoltaic assembly 90 through patterned conductive material layer 30, which functions as a conductive path for collecting electromotive power generated by the photovoltaic cells 12 within the photovoltaic assemblies 90.

At least one support structure 120 may be optionally present between the focusing elements 130 and the base plate 110. The at least one support structure 120 can be a box frame or a set of columnar support structures or any other suitable mechanical structure configured to keep the focusing elements 130 in a fixed position relative to the array of the photovoltaic assembly 90.

CPV modules 140 are mounted on a tracker (not shown) which allows them to track the path of the sun throughout the days. The tracker is a mechanism that steadily changes the orientation of the modules so that their lens to cell direction, which is a direction approximately perpendicular to the plane of the lens 132, keeps pointing at the sun. The sun tracking motion is required to keep the focal spot of sun light aimed at the solar cell. This dynamic alignment of module direction onto the sun direction is key to proper operation of CPV.

The focusing elements 130 and each light pipe 94 are employed in conjunction to provide efficient light concentration. The focusing element 130 collects the light and focuses it onto a spot, which is usually equal or larger than, a photovoltaic cell 92. The size of the spot is preferably less than the front surface area of the corresponding light pipe 94, i.e., less than the area of the frontal surface of the light pipe 94 that is more proximal to the focusing element 130 than to the photovoltaic cell 92. The light pipe 94 guides the light impinging on the front surface to the photovoltaic cell 92 below. Typically, the light pipe 94 has a back surface area that does not exceed the area of the photovoltaic cell 92. For example, the light pipe 94 can have a trapezoidal vertical cross-sectional area that has a longer side at the top (i.e., the upper side that is most proximal to the focusing element 130 and most distal from the photovoltaic cell 92) and a shorter side at the bottom (i.e., the lower side that is most distal from the focusing element 130 and most proximal to the photovoltaic cell 92). Alternatively, the sidewalls of the vertical cross-sectional area of the light pipe 94 can have a curvature.

Each light pipe 94 can be made out of a solid piece of optically transparent material having surfaces with smooth optical quality finish. The primary objective of the light pipes is to capture a substantial amount of sun rays that would otherwise be lost, and to redirect them onto an area precisely matching the cell area, i.e., the active area of the underlying photovoltaic cell 92. A further purpose of the light pipe is to homogenize the light it conveys to the photovoltaic cell for uniform illumination of the cell. This is important for both cell efficiency and the avoidance of thermal hot spots. The light redirection of the solar rays can occur, for example, via total internal reflection (TIR) on the trapezoidal sidewalls of the light pipe 94. Because the TIR process is very efficient, the power loss associated to these additional reflections is negligible.

Typically, the photovoltaic cells 12 are multijunction cells having different photovoltaic junctions optimized for absorbing photons in different wavelength ranges. The multiple photovoltaic junctions are located at different depths from the topmost surfaces of the photovoltaic cells 12. For most efficient power conversion, each area of the photovoltaic cell 92 should be illuminated by equal amounts of the solar rays in the multiple spectral regions. When using focusing elements 130 having different focal lengths for different wavelengths, the need to distribute solar rays evenly across the multiple spectral regions becomes a requirement for high performance since the multiple spectral regions are focused differently.

Referring to FIGS. 3A-3C, a first exemplary photovoltaic structure according to a first embodiment of the present disclosure is illustrated. The first exemplary photovoltaic structure including a stack, from bottom to top, of a conductive substrate 10, at least one electrical isolation layer 20, a patterned conductive material layer 30, and at least one photovoltaic element 92 that is mounted to a portion of the patterned conductive material layer 30.

The conductive substrate 10 includes a thermally conductive material. In one embodiment, the conductive substrate 10 includes a material that is thermally conductive and electrically conductive. In one embodiment, the conductive substrate 10 includes a metallic material. For example, the conductive substrate 10 can include aluminum, copper, silver, gold, zinc, tungsten, zirconium, iron or a metallic alloy having a large thermal conductivity greater than 50 W/(m·K).

In one embodiment, the conductive substrate 10 can include a metal or a metallic alloy that can be oxidized or nitrided to form a surface layer of an electrically insulating metal-containing compound, i.e., an electrically insulating metal-containing compound layer. For example, the conductive substrate 10 can include aluminum, which can be oxidized to form an aluminum oxide layer that is an electrically insulating metal-containing compound.

The thickness of the conductive substrate 10 is selected to provide structural support to the first exemplary photovoltaic structure. In one embodiment, the thickness of the conductive substrate 10 can be selected to provide sufficient thermal conduction to dissipate heat that is generated from the at least one photovoltaic element 92. For example, the thickness of the conductive plate 10 can be from 20 micron to 2 cm, although lesser and greater thicknesses can also be employed. In one embodiment, the thickness of the conductive plate 10 can be from 1 mm to 2 mm.

The at least one electrical isolation layer 20 includes at least one layer including an electrically isolating material.

The thickness of the at least one electrical isolation layer 20 is selected such that conduction of heat from the patterned conductive material layer 30 into the conductive substrate 10 is not substantially impeded. For example, the thickness of the at least one electrical isolation layer 20 can be selected such that conduction of heat from the patterned conductive material layer 30 into the conductive substrate is not impeded by more than 10% relative to a hypothetical structure in which the patterned conductive material layer 30 is in contact with the conductive substrate 10. In one embodiment, the thickness of the at least one electrical isolation layer 20 can be less than 20 microns. In another embodiment, the thickness of the at least one electrical isolation layer 20 can be from 1 nm to 1,000 microns.

The at least one electrical isolation layer 20 can include a single homogenous layer or a stack of multiple electrical isolation layers each including a dielectric material having different compositions. In one embodiment, the at least one electrical isolation layer 20 can include a stack, from bottom to top, of a lower electrical isolation layer 22 and an upper electrical isolation layer 24. Each layer in at least one electrical isolation layer 20 can be formed as a blanket dielectric layer having a same thickness throughout.

In one embodiment, the lower electrical isolation layer 22 can be an electrically insulating metal-containing compound layer derived from a surface portion of the conductive substrate 10 by oxidation, nitridation, or a combination thereof. In this case, the lower electrical isolation layer 22 can include an oxide, a nitride, or an oxynitride of the metallic material of the conductive substrate 10. For example, if the conductive substrate 10 includes aluminum, the lower electrical isolation layer 22 can be an aluminum oxide layer formed by anodization of the top surface of the conductive substrate 10.

In one embodiment, the upper electrical isolation layer 24 can include an inorganic dielectric material. In one embodiment, the inorganic dielectric material can be a dielectric metal oxide, a dielectric metal nitride, a dielectric metal oxynitride, or a combination thereof.

In one embodiment, the upper electrical isolation layer 24 can include a dielectric metal oxide, dielectric metal nitride, or a dielectric metal oxynitride having a dielectric constant greater than 8.0, which is known in the art as a high-k dielectric material. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In one embodiment, the upper electrical isolation layer 24 can include a layer of titanium oxide ($TiO_2$).

In another embodiment, the upper electrical isolation layer 24 can include a dielectric semiconductor oxide, a dielectric semiconductor nitride, or a dielectric semiconductor oxynitride. For example, the upper electrical insulation layer 24 can include silicon oxide, silicon nitride, silicon oxynitride, or a combination thereof.

In one embodiment, the upper electrical isolation layer 24 can include an organic dielectric material. In one embodiment, the organic dielectric material can be a polymer that includes an epoxy, a silicone and an acrylic material.

In one embodiment, the upper electrical isolation layer 24 can include TechniFlex™, which is a commercial epoxy-based material made by Technic Corp.

The patterned conductive material layer 30 includes at least one metallic wiring structure (34A, 34B) having a first thickness and at least one metallic receiver plate 32. The lateral dimensions of the at least one metallic wiring structure (34A, 34B) and the first thickness can be selected to provide sufficient electrical conductivity for each of the at least one metallic wiring structure (34A, 34B). For example, the first thickness can be from 0.5 microns to 100 microns, although lesser and greater thicknesses can also be employed. Each of the at least one metallic wiring structure (34A, 34B) includes a first metallic material and contacts a top surface of the at least one electrical isolation layer 20.

Each of the at least one metallic receiver plate 32 has a second thickness that is greater than or equal to the first thickness, and contacts the top surface of the at least one electrical isolation layer 20. The size of each of the at least one metallic receiver plate 32 and the second thickness can be selected to provide sufficient thermal spreading of the heat generated at the at least one photovoltaic element 92. For example, the second thickness can be from 10 microns to 1 mm, although lesser and greater thicknesses can also be employed.

Each of the at least one metallic receiver plate 32 includes a stack of a lower metallic receiver plate portion 32L and an upper metallic receiver plate portion 32U having the same area as the underlying lower metallic receiver plate portion 32L. Each of the at least one lower metallic receiver plate portion 32L includes the first metallic material, i.e., has the same composition as the at least one metallic wiring structure (34A, 34B). Each of the at least one lower metallic receiver plate portion 32L has the first thickness, i.e., has the same thickness as the at least one metallic wiring structure (34A, 34B). Each of the at least one upper metallic receiver plate portion 32U has a thickness that is equal to the difference between the second thickness and the first thickness, i.e., the second thickness less the first thickness.

Each of the at least one upper metallic receiver plate portion 32U includes a second metallic material, which can be the same or different from the first material. In one embodiment, each of the first metallic material and the second metallic material can independently be selected from copper, aluminum, silver, gold, zinc, tungsten, zirconium, or a metallic alloy having a thermal conductivity greater than 150 W/(m·K).

The first metallic wiring structure 34A and a lower metallic receiver plate portion 32L underlying the selected photovoltaic element 92 can laterally contact each other without any microscopic interface therebetween, i.e., can be a single contiguous structure without any detectable microscopic interface therebetween.

In one embodiment, the at least one metallic wiring structure (34A, 34B) includes a first metallic wiring structure 34A that is electrically shorted (connected) to a first output node of a photovoltaic element selected from the at least one photovoltaic element 92, and a second metallic wiring structure 34B that is electrically shorted to a second output node of the selected photovoltaic element. The first metallic wiring structure 34A can be electrically shorted to the first output node of the selected photovoltaic element 92 via one of the at least one metallic receiver plate 32. Specifically, structures of the first output node of the selected photovoltaic element 92 can be located on the bottom surface of the selected photovoltaic element 92 and can contact a top surface of an underlying metallic receiver plate 32.

The second metallic wiring structure 34B is electrically shorted to the second output node of the selected photovoltaic element 92A. In one embodiment, the second metallic wiring structure 34B can be electrically shorted to the second output node of the selected photovoltaic element 92A through a plurality of conductive wires 36, which are bonded to structures of the second output node of the selected photovoltaic element 92 at one end and bonded to the second metallic wiring structure 34B.

Depending on the method of manufacturing the patterned conductive material layer 30, the first metallic material of the at least one metallic wiring structure (34A, 34B) and the at least one lower metallic receiver plate portion 32L and the second metallic material of the at least one upper metallic receiver plate portion 32U can be the same or different.

In one embodiment, the first metallic material and the second metallic material can be different from each other. In this case, a set of contiguous grain boundaries can extend throughout a microscopic interface between the upper metallic receiver plate portion 32U and the lower metallic receiver plate portion 32L within each of the at least one metallic receiver plate 32.

In another embodiment, the first metallic material and the second metallic material can be the same. In one case, a set of contiguous grain boundaries can extend throughout a microscopic interface between the upper metallic receiver plate portion 32U and the lower metallic receiver plate portion 32L within each of the at least one metallic receiver plate 32. In another case, a microscopic interface does not exist between the upper metallic receiver plate portion 32U and the lower metallic receiver plate portion 32L within each of the at least one metallic receiver plate 32.

In another embodiment, the first metallic material and the second metallic material can be the same, and can be coated with a protective layer such as Au, Ag, Pt, Ni, Zn, Sn or other metal or alloy that resists corrosion.

In one embodiment, one of more of the at least one metallic receiver plate 32 can have an area including an entirety of the area of an overlying photovoltaic element 92.

Each of the at least one metallic receiver plate 32 can be configured to enable mounting of one or more of the at least one photovoltaic element 92. Each of the at least one photovoltaic element 92 can be any photovoltaic element known in the art that generates electromotive power from a radiation such as solar radiation. The first exemplary photovoltaic structure can be embedded within any CPV system such as the exemplary CPV system illustrated in FIGS. 1A, 1B, and 2.

Figures 4A, 4B, 4C:
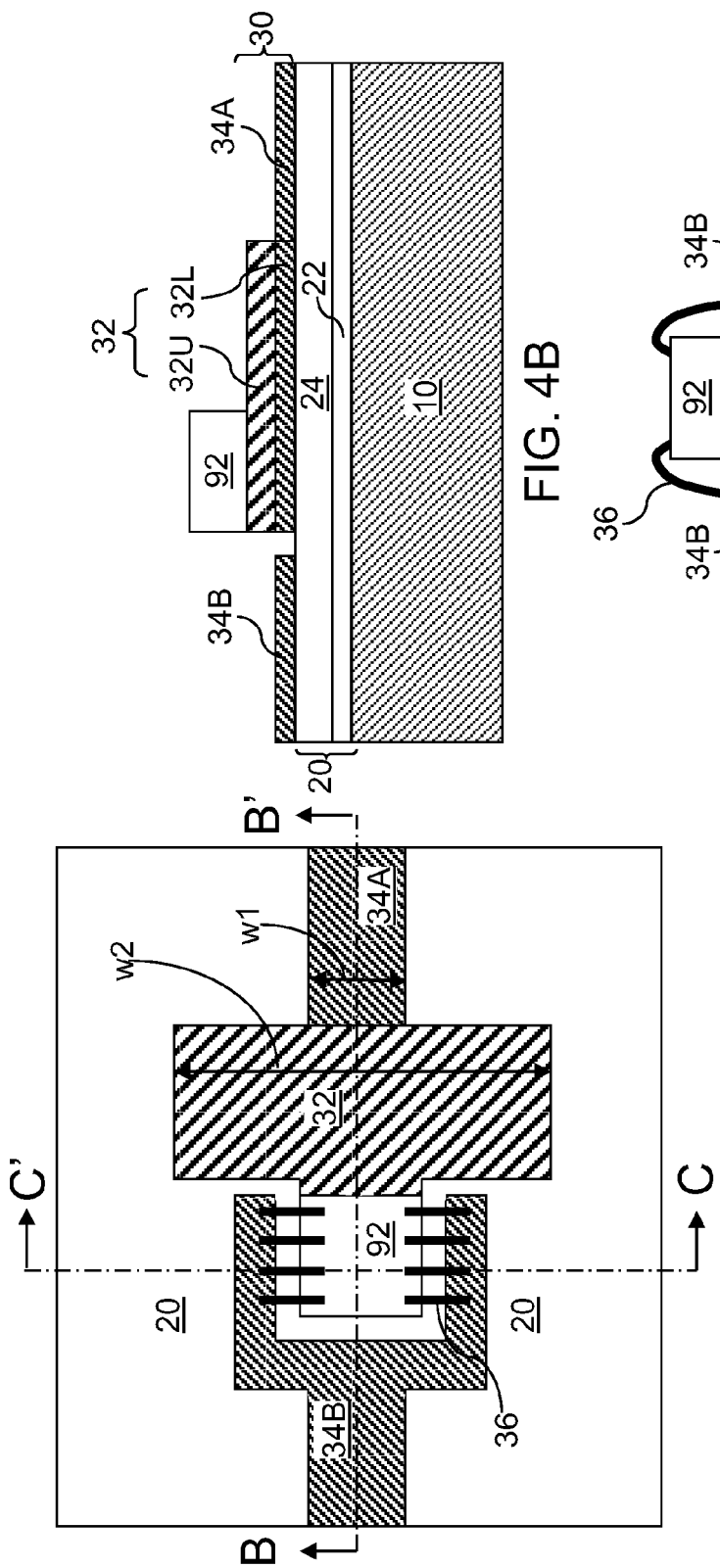
FIG. 4A is a top-down view of a second exemplary photovoltaic structure according to a second embodiment of the present disclosure.
FIG. 4B is a vertical cross-sectional view of the second exemplary photovoltaic structure of along the vertical plane B-B' of FIG. 4A.
FIG. 4C is a vertical cross-sectional view of the second exemplary photovoltaic structure of along the vertical plane C-C' of FIG. 4A.

Referring to FIGS. 4A-4C, a second exemplary photovoltaic structure according to a second embodiment of the present disclosure can be derived from the first exemplary photovoltaic structure by modifying a metallic receiver plate 32 such that the area of the metallic receiver plate 32 is expanded. Expansion of the area of the metallic receiver plate 32 enhances thermal spreading within the metallic receiver plate 32. In one embodiment, the second thickness can be selected to be greater than the first thickness at least by a factor of 2 to provide enhanced thermal spreading within the metallic receiver plate. In another embodiment, the second thickness can be selected to be greater than the first thickness at least by a factor of 5. In another embodiment, the second thickness can be selected to be greater than the first thickness at least by a factor of 10.

In one embodiment, one or more of the at least one metallic receiver plate 32 can have a greater width, i.e., a second width w2 as illustrated in FIG. 4A, than a metallic wiring structure among the at least one metallic wiring structure that is in lateral contact with the metallic receiver plate, i.e., the first metallic wiring structure 34A illustrated in FIG. 4A and having a first width w1.

Figure 5:
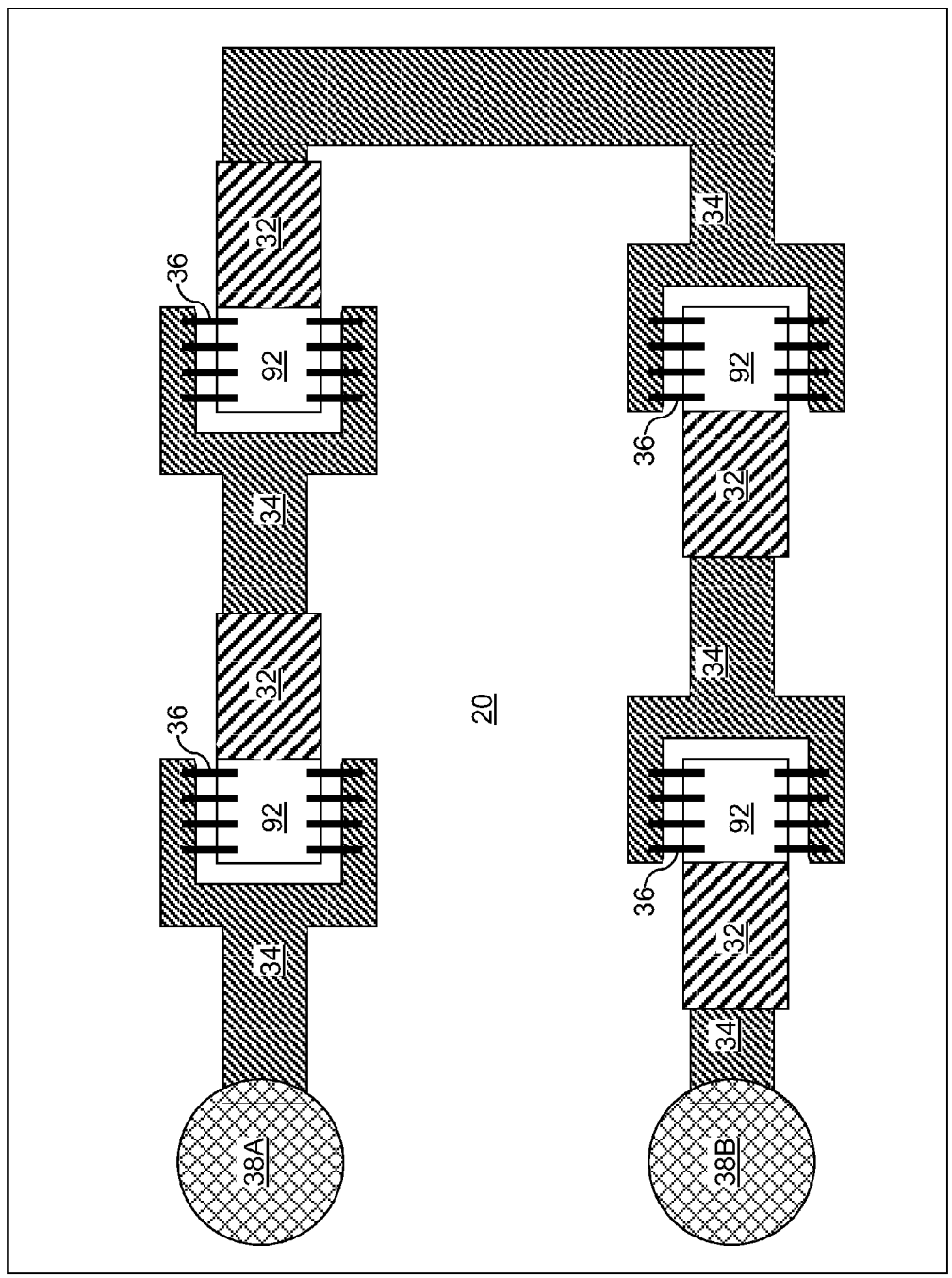
FIG. 5 is a top-down view of a third exemplary photovoltaic structure according to a third embodiment of the present disclosure.

Referring to FIG. 5, a third exemplary photovoltaic structure according to a third embodiment of the present disclosure includes a stack, from bottom to top, of a conductive substrate 10 (not shown, see FIGS. 3B, 3C, 4B, and 4C), at least one electrical isolation layer 20, a patterned conductive material layer 30 that includes a plurality of metallic wiring structures 34 and a plurality of metallic receiver plates 32, and a plurality of photovoltaic elements 92 that are mounted to the plurality of metallic receiver plates 32. The plurality of metallic wiring structures 32 includes portions having the geometrical features of a first metallic wiring structure illustrated in FIGS. 3A-3C and 4A-4C and portions having the geometrical features of a second metallic wiring structure illustrated in FIGS. 3A-3C and 4A-4C.

Each of the photovoltaic elements 92 overlies one of the metallic receiver plates 34. In one embodiment, for each vertically contacting pair of a metallic receiver plate 32 and a photovoltaic element 92, a horizontal cross-sectional area of the photovoltaic element 92 can be entirely within a horizontal cross-sectional area of the metallic receiver plate 32. Each of the plurality of metallic receiver plates 32 can have an area that includes the entirety of the area of an overlying photovoltaic element 92.

The plurality of metallic receiver plates 32 can contact each of the plurality of photovoltaic elements 92. The plurality of metallic wiring structures 34 can electrically connect nodes of the plurality of photovoltaic elements. For example, the plurality of metallic wiring structures 34 can electrically connect nodes of the plurality of photovoltaic elements in a series connection to increase the output voltage across a first external connection structure 38A and a second external connection structure 38B. Alternately or additionally, the plurality of metallic wiring structures 34 can electrically connect nodes of the plurality of photovoltaic elements in a parallel connection to increase the output current from the first external connection structure 38A and the second external connection structure 38B. The first external connection structure 38A and the second external connection structure 38B can be configured to be electrically connected to external power bus lines.

In one embodiment, the photovoltaic element 92 can be located within a region laterally bounded by a C-shaped portion of a second metallic wiring structure 34B (See FIGS. 3A and 4A) among the metallic wiring structures 34. In one embodiment, a plurality of conductive wires 36 can be bonded to structures of a node of each photovoltaic element 92 at one end and can be bonded to a C-shaped portion of a second metallic wiring structure 34B (See FIGS. 3A and 4A) among the metallic wiring structures 34 at another end.

In one embodiment, one or more of the plurality of metallic receiver plate 32 can laterally contact one of the plurality of metallic wiring structures 32. In one embodiment, a first node of each of the plurality of photovoltaic elements 92 can be electrically shorted to one of the plurality of metallic receiver plates, and a second node of each of the plurality of photovoltaic elements 92 can be electrically shorted to one of the plurality of metallic wiring structures 34. A plurality of conductive wires 36 can be employed to provide electrical connections between the second node of each photovoltaic element 32 and one of the plurality of metallic wiring structures 34. For each photovoltaic element 34, for example, a set of conductive wires 36 can be bonded to structures (e.g., a bonding pad structure) of the second node of the photovoltaic element 92 at one end and bonded to a metallic wiring structure 34 at another end.

FIGS. 6A, 6B, 7A, 7B, 8A, 8B, 9A, 9B, 10A, 10B, 11A, and 11B illustrate a first method for forming any of the first, second, or third exemplary photovoltaic structure. Referring to FIGS. 6A and 6B, a lower electrical isolation layer 22 is formed on the conductive substrate 10. In one embodiment, the lower electrical isolation layer 22 can be an electrically insulating metal-containing compound layer derived from a surface portion of the conductive substrate 10 by oxidation, nitridation, or a combination thereof, as discussed above.

Referring to FIGS. 7A and 7B, an upper electrical isolation layer 24 can be formed by adding at least one dielectric material. The at least one dielectric material that forms the upper electrical isolation layer 24 can be added, for example, by spin coating, spraying, chemical vapor deposition (CVD), physical vapor deposition (PVD), vacuum evaporation, or a combination thereof. In other words, the at least one dielectric material is deposited to form the upper electrical isolation layer 24. As used herein, "deposition" refers to any act of adding a material, and to "deposit" refers to the act of adding a material by any method known in the art. As discussed above, the upper electrical isolation layer 24 can include at least one inorganic dielectric material, at least one organic dielectric material, or a combination of at least one inorganic dielectric material and at least one organic dielectric material.

In one embodiment, the combination of the lower electrical isolation layer 22 and the upper electrical isolation layer 24 constitute the at least one electrical isolation layer 20. In another embodiment, the lower electrical isolation layer 22 can be omitted and the at least one electrical isolation layer 20 can consist of the upper electrical isolation layer 24. In yet another embodiment, the upper electrical isolation layer 24 can be omitted and the at least one electrical isolation layer 20 can consist of the lower electrical isolation layer 22.

Referring to FIGS. 8A and 8B, a blanket lower conductive material layer 33 is deposited on the top surface of the at least one electrical isolation layer 20. The blanket lower conductive material layer 33 is a lower conductive material layer that is subsequently patterned to form the at least one metallic wiring structure (34A, 34B) and the at least one metallic receiver plate 32 (See FIGS. 3A-3C and 4A-4C). The blanket lower conductive material layer 33 can be deposited, for example, by physical vapor deposition (PVD), chemical vapor deposition (CVD), vacuum evaporation, or a combination of a method that deposits a seed layer (e.g., PVD, CVD, or vacuum evaporation) and electroplating and/or electroless plating. The thickness of the blanket lower conductive material layer 33 can be the same as the first thickness, which is the thickness of the at least one metallic wiring structure (34A, 34B) and the at least one metallic receiver plate 32.

Referring to FIGS. 9A and 9B, the blanket lower conductive material layer 33, i.e., the lower conductive material layer, is patterned, for example, by lithographic patterning to form a patterned lower conductive material layer 34P, which includes the at least one metallic wiring structure (34A, 34B; See FIGS. 3A-3C and 4A-4C) and a lower portion of each of the at least one metallic receiver plate, i.e., the at least one lower metallic receiver plate portion (32; See FIGS. 3A-3C and 4A-4C).

In a variation of the first method for forming the first exemplary photovoltaic structure, the processing steps of FIGS. 8A-8C and 9A-9C can be substituted with a screen printing method, which deposits the patterned lower conductive material layer 34P by screen printing without the intermediate step of FIGS. 8A-8C.

Referring to FIGS. 10A and 10B, a dielectric masking layer 37 is deposited over the at least one electrical isolation layer 20 and the patterned lower conductive material layer 34P. The dielectric masking layer 37 can be, for example, a photoresist layer, which can be patterned to form at least one opening corresponding to the shapes of the at least one upper metallic receiver plate portion 32U illustrated in FIGS. 3A-3C and 4A-4C. The patterned dielectric masking layer 37 can be present over the at least one electrical isolation layer 20 and a portion of the patterned lower conductive material layer 34P that does not overlap with the area of the at least one upper metallic receiver plate portion 32U to be subsequently formed.

An upper conductive material layer including at least one upper metallic receiver plate portion 32U can be deposited, for example, by electroplating or electroless plating. In this case, the at least one upper metallic receiver plate portion 32U can include any metal that can be plated by electroplating or by electroless plating. For example, the at least one upper metallic receiver plate portion 32U can include copper, nickel, cobalt, or combinations thereof. The upper lower conductive material layer is plated on physically exposed surface of the patterned lower conductive material layer 34P. The upper conductive material layer includes an upper portion of each of the at least one metallic receiver plate, and is formed directly on the patterned lower conductive material layer 34P.

In case the at least one upper metallic receiver plate portion 32U is formed by electroplating, the plated copper material of the at least one upper metallic receiver plate portion 32U includes O, N, C, Cl, and S due to the nature of the process employed for formation, i.e., due to the nature of the plating process. The sum of concentrations of O, N, C, Cl, and S is typically from about 1 ppm to about 200 ppm.

In one embodiment, a set of contiguous grain boundaries can extend throughout a microscopic interface between the upper metallic receiver plate portion 32U and the lower metallic receiver plate portion 32L within each of the at least one metallic receiver plate 32.

In a variation of the first method for forming the first exemplary photovoltaic structure, the processing steps of FIGS. 9A-9C can be substituted with a screen printing method, which deposits an upper conductive material layer including at least one upper metallic receiver plate portion 32U by screen printing without the intermediate step of FIGS. 8A-8C. In this case, an anneal can be performed to enhance adhesion of the at least one upper metallic receiver plate portion 32U to the at least one lower metallic receiver plate portion 32L.

A conductive material layer 30, which includes the patterned lower conductive material layer 34P and the upper conductive material layer (that includes the at least one upper metallic receiver plate portion 32U), is thus formed on the at least one electrical isolation layer 20.

Referring to FIGS. 11A and 11B, the dielectric masking layer 37 is removed, for example, by ashing.

Subsequently, at least one photovoltaic element 92 can be mounted on the at least one metallic receiver plate 92 employing methods known in the art. As discussed above, a first node of each of the at least one photovoltaic element 92 can be electrically shorted to one of the at least one metallic receiver plate 32, and a second node of each of the at least one photovoltaic element 92 can be electrically shorted to one of the at least one metallic wiring structure (34B in FIGS. 3A-3C and 4A-4C or 34 in FIG. 5).

The resulting structure can be identical to one of the first, second, or third exemplary photovoltaic structures as illustrated in FIG. 3A-3C, 4A-4C, or 5. The patterned conductive material layer 30 includes at least one metallic wiring structure (34A, 34B or 34) having a first thickness and contacting a top surface of the at least one electrical isolation layer 20 and at least one metallic receiver plate 32 having a second thickness that is greater than the first thickness and contacting the top surface of the electrical isolation layer. Each of the at least one metallic receiver plate 32 includes a stack of a lower metallic receiver plate portion 32L and an upper metallic receiver plate portion 32U.

Figure 12A:
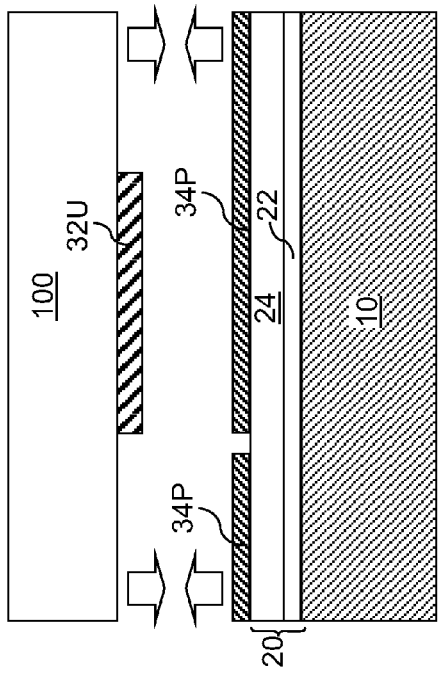
FIG. 12A is a top-down view of an intermediate structure for forming the first, second, or third exemplary photovoltaic structure prior to bonding a first structure including a conductive substrate, at least one electrical isolation layer, and a patterned lower conductive material layer and a second structure including a carrier substrate and a patterned upper conductive material layer according to an embodiment of the present disclosure.
Figure 12B:
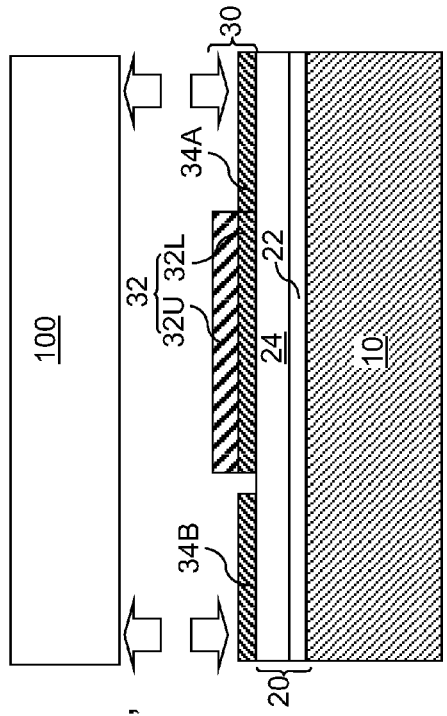
FIG. 12B is a vertical cross-sectional view of the intermediate structure of FIG. 12A.

FIGS. 12A, 12B, 13A, and 13B illustrate a second method for forming any of the first, second, or third exemplary photovoltaic structure. An upper conductive material layer including an upper portion of each of the at least one metallic receiver plate can be transferred from a carrier substrate onto a lower conductive material layer. Referring to FIGS. 12A and 12B, the structure illustrated in FIGS. 9A and 9B is provided, which is herein referred to as a first structure. The first structure includes a conductive substrate 10, at least one electrical isolation layer 20, and a patterned lower conductive material layer 30. Further, a second structure including a carrier substrate 100 and a patterned upper conductive material layer including at least one upper metallic receiver plate portion 32U is provided. The second structure (100, 32U) can be formed, for example, by providing a carrier substrate 100, which can be a dielectric substrate, a semiconductor substrate, or a metallic substrate provided that the surface of the carrier substrate 100 includes a material that can be subsequently separated from the patterned upper conductive material layer.

In one embodiment, the patterned upper conducive material layer including the at least one upper metallic receiver plate portion 32U can be formed by deposition of a blanket metallic layer and subsequent patterning of the blanket metallic layer by lithographic methods or any other patterning methods known in the art. In another embodiment, the patterned upper conductive material layer including the at least one upper metallic receiver plate portion 32U can be formed as a patterned layer, for example, by screen printing. The thickness of the patterned upper conductive material layer including the at least one upper metallic receiver plate portion 32U is equal to the difference between the second thickness and the first thickness, and can be in a range from 10 microns to 1 mm, although lesser and greater thicknesses can also be employed. The pattern of the at least one upper metallic receiver plate portion 32U within the patterned upper conductive material layer as formed on the carrier substrate 100 is the minor image of the at least one upper metallic receiver plate portion 32U in the first, second, or third exemplary photovoltaic structure illustrated in FIG. 3A-3C, 4A-4C, or 5.

The patterned upper conductive material layer on the carrier substrate 100 is bonded with the patterned lower conductive material layer 34P of the first substrate (10, 20, 30) employing bonding methods known in the art. For example, the patterned upper conductive material layer is brought into contact with the patterned lower conductive material layer 34P, and is subsequently annealed at an elevated temperature so that the grains of the patterned upper conductive material layer is brought into contact with the patterned lower conductive material layer 34P grow at the interface therebetween. In this case, a set of contiguous grain boundaries can extend throughout a microscopic interface between the upper metallic receiver plate portion 32U and the lower metallic receiver plate portion 32L within each of the at least one metallic receiver plate 32.

Figure 13A:
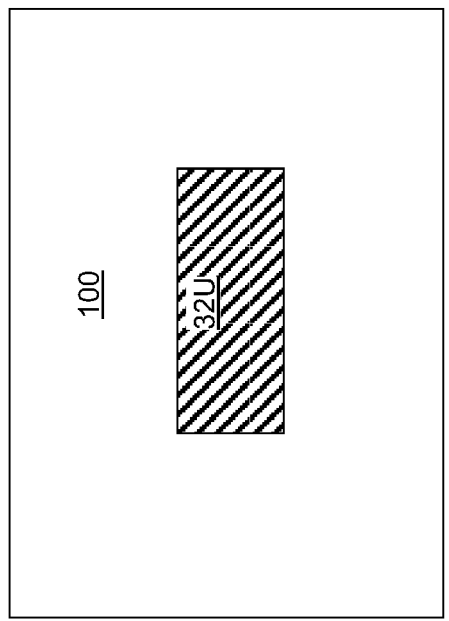
FIG. 13A is a top-down view of the carrier substrate and the first exemplary photovoltaic structure after separating the carrier substrate from the first exemplary photovoltaic structure according to an embodiment of the present disclosure.
Figure 13B:
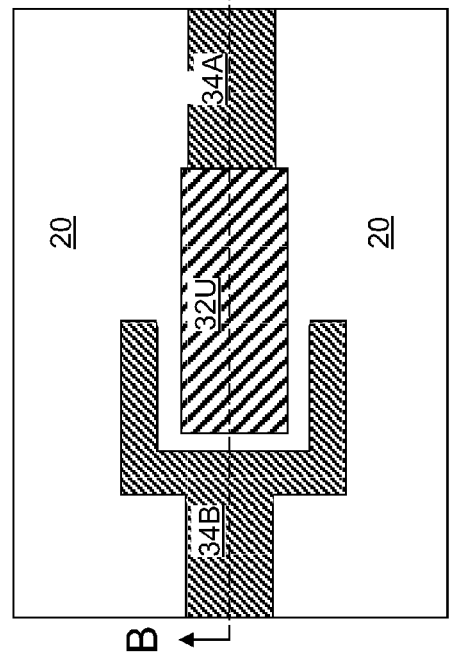
FIG. 13B is a vertical cross-sectional view of the first exemplary photovoltaic structure of FIG. 13A.

Referring to FIGS. 13A and 13B, the carrier substrate 100 is separated from the patterned upper conducive material layer including the at least one upper metallic receiver plate portion 32U employing methods known in the art. Subsequently, at least one photovoltaic element 92 can be mounted on the at least one metallic receiver plate 92 employing methods known in the art. In one embodiment, mounting of the at least one photovoltaic element 92 can be accomplished with a solder process. As discussed above, a first node of each of the at least one photovoltaic element 92 can be electrically shorted to one of the at least one metallic receiver plate 32, and a second node of each of the at least one photovoltaic element 92 can be electrically shorted to one of the at least one metallic wiring structure (34B in FIGS. 3A-3C and 4A-4C or 34 in FIG. 5). In one embodiment, this electrical connection can be accomplished using wire bonding methods. In an alternate embodiment, the electrical connection can be established using strap bonding methods. The resulting structure can be identical to one of the first, second, or third exemplary photovoltaic structures as illustrated in FIG. 3A-3C, 4A-4C, or 5.

Figure 14A:
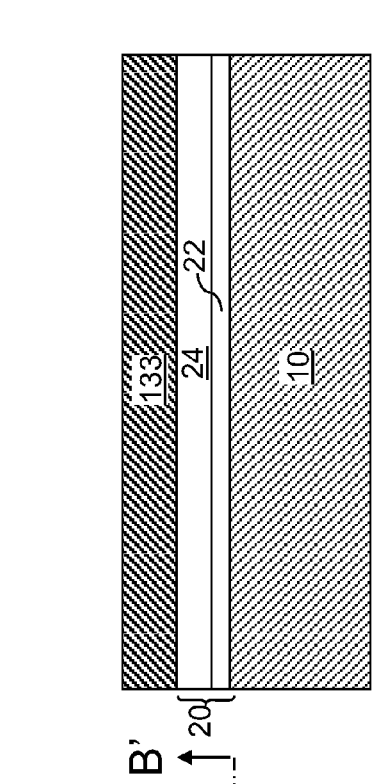
FIG. 14A is a top-down view of an intermediate structure for forming the first, second, or third exemplary photovoltaic structure after formation of a blanket conductive material layer according to an embodiment of the present disclosure.
Figure 14B:
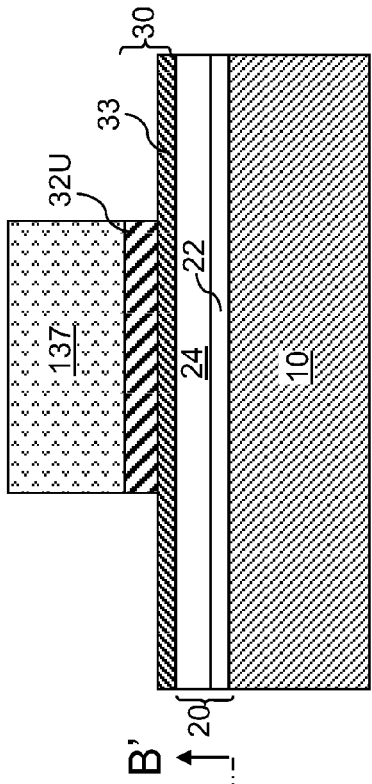
FIG. 14B is a vertical cross-sectional view of the intermediate structure of FIG. 14A.

FIGS. 14A, 14B, 15A, 15B, 16A, 16B, 17A, and 17B illustrate a third method for forming any of the first, second, or third exemplary photovoltaic structure. Referring to FIGS. 14A and 14B, a blanket conductive material layer 133 having the second thickness is deposited directly on the top surface of the at least one electrical isolation layer 20 of a structure of FIGS. 7A and 7B. The blanket conductive material layer 133 can include a stack of a first metallic material having the first thickness and a second metallic material having the thickness that is the same as the difference between the second thickness and the first thickness. In one embodiment, the first metallic material and the second metallic material can be the same, and the entirety of the blanket conductive material layer 133 can have the same metallic material. The blanket lower conductive material layer 133 can be deposited, for example, by physical vapor deposition (PVD), chemical vapor deposition (CVD), vacuum evaporation, or a combination of a method that deposits a seed layer (e.g., PVD, CVD, or vacuum evaporation) and electroplating and/or electroless plating.

Figure 15A:
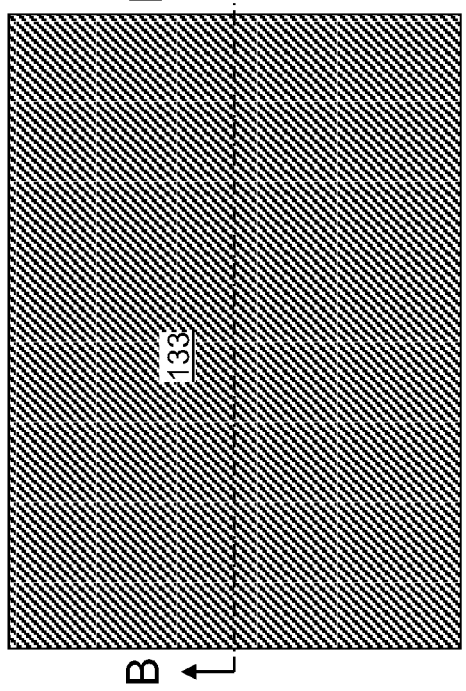
FIG. 15A is a top-down view of an intermediate structure for forming the first, second, or third exemplary photovoltaic structure after patterning an upper portion of the blanket conductive material layer according to an embodiment of the present disclosure.
Figure 15B:
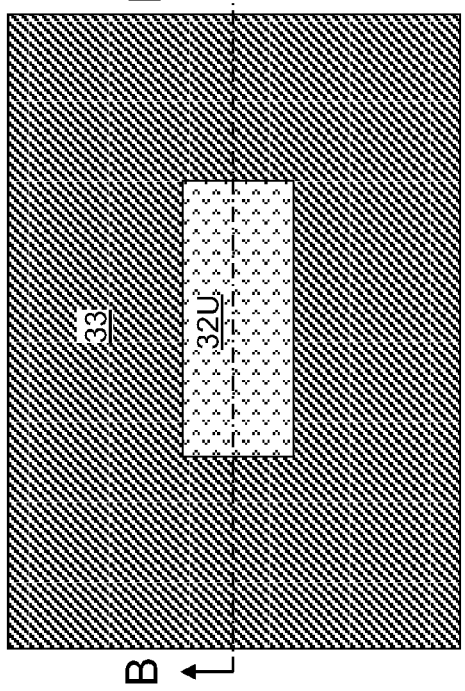
FIG. 15B is a vertical cross-sectional view of the intermediate structure of FIG. 15A.

Referring to FIGS. 15A and 15B, an upper portion of the blanket conductive material layer 133 having a thickness that is the second thickness less the first thickness, which is herein referred to as the upper conductive material layer, is patterned. For example, a photoresist material can be applied and patterned to form a first patterned photoresist layer 137 that is present in area(s) corresponding to the area(s) of the at least one upper metallic receiver plate portion 32U in FIG. 3A-3C, 4A-4C, or 5. The pattern in the first patterned photoresist layer 137 is transferred into the upper portion of the blanket conductive material layer 133, i.e., into the portion of the blanket conductive material layer 133 spaced from the top surface of the at least one electrical isolation layer 20 by more than the first thickness, by an etch that employs the first patterned photoresist layer 137 as an etch mask. The etch can be an isotropic etch such as a wet etch or an anisotropic etch such as a reactive ion etch. The upper portion of the blanket conductive material layer 133 having a thickness that is the second thickness less the first thickness is patterned to form the at least one upper metallic receiver plate portion 32U. The first patterned photoresist layer 137 can be subsequently removed, for example, by ashing or a wet etch.

Referring to FIGS. 16A and 16B, a lower portion of the blanket conductive material layer 133 having the first thickness, which is herein referred to as the lower conductive material layer, is patterned. For example, a photoresist material is applied and patterned to form a second patterned photoresist layer 139 that is present in area(s) corresponding to the area(s) of the at least one lower metallic receiver plate portion 32L and the at least one metallic wiring structure (34A, 34B, 34) in FIG. 3A-3C, 4A-4C, or 5. The pattern in the second patterned photoresist layer 139 is transferred into the lower portion of the blanket conductive material layer 133, i.e., into the portion of the blanket conductive material layer 133 spaced from the top surface of the at least one electrical isolation layer 20 by less than the first thickness, by an etch that employs the second patterned photoresist layer 139 as an etch mask. The etch can be an isotropic etch such as a wet etch or an anisotropic etch such as a reactive ion etch. The lower portion of the blanket conductive material layer 133 having the first thickness is patterned to form the at least one lower metallic receiver plate portion 32L and the at least one metallic wiring structure (34A, 34B, 34).

Referring to FIGS. 17A and 17B, the second patterned photoresist layer 137 can be subsequently removed, for example, by ashing or a wet etch. Subsequently, at least one photovoltaic element 92 can be mounted on the at least one metallic receiver plate 92 employing methods known in the art. As discussed above, a first node of each of the at least one photovoltaic element 92 can be electrically shorted to one of the at least one metallic receiver plate 32, and a second node of each of the at least one photovoltaic element 92 can be electrically shorted to one of the at least one metallic wiring structure (34B in FIGS. 3A-3C and 4A-4C or 34 in FIG. 5). The resulting structure can be identical to one of the first, second, or third exemplary photovoltaic structures as illustrated in FIG. 3A-3C, 4A-4C, or 5.

The various photovoltaic structures of the present disclosure can be implemented as a CPV system illustrated in FIGS. 1A, 1B, and 2. For example, at least one support structure 120 can be added to the various exemplary structures of FIG. 3A-3C, 4A-4C, or 5 to laterally enclose the same. Further, at least one focusing element 132 (See FIGS. 1A and 1B) configured to focus light onto the at least one photovoltaic element 92 can be added to the various exemplary structures of FIGS. 3A-3C, 4A-4C. In one embodiment, the at least one photovoltaic element 92 can be an array of photovoltaic elements 92, and the at least one focusing element 132 can be an array of focusing elements 132 configured to focus light on each photovoltaic element 92 among the array of photovoltaic elements 92. In one embodiment, the at least one focusing element 132 can be at least one Fresnel lens. In one embodiment, at least one light pipe 94 (See FIG. 2) can be added to the various exemplary structures of FIGS. 3A-3C, 4A-4C. Each of the at least one light pipe 94 can be configured to guide light to a front surface of one of the at least one photovoltaic element 92.

If the blanket conductive material layer 133 includes an interface between two different materials at a distance from the top surface of the at least one electrical isolation layer 20 that is the same as the magnitude of the first thickness, a set of contiguous grain boundaries can extend throughout a microscopic interface between the upper metallic receiver plate portion 32U and the lower metallic receiver plate portion 32L within each of the at least one metallic receiver plate 32. Otherwise, a microscopic interface does not exist between the upper metallic receiver plate portion 32U and the lower metallic receiver plate portion 32L within each of the at least one metallic receiver plate 32.

In general, electrical power can be generated from a source of radiation more efficiently and/or with lesser cost and/or with less maintenance than by methods known in the art by providing a structure including at least one focusing element 130, at least one light pipe 94 of the present disclosure, and at least one photovoltaic cell 92, and by directing light from a light source (such as the sun) to the light pipe 94 by employing the focusing element 130. The photovoltaic cell 92 generates electrical power upon irradiation by light having homogenized intensity, which is provided by the light pipe 94 of the present disclosure.

It is typical practice in solar concentrator systems to use intermediate cell packaging, i.e., to affix and electrically connect the cell to an intermediate package and then to affix and electrically connect the package to a back plate. This is costly and complicated from a manufacturing point of view. An embodiment of the present disclosure enables elimination of the intermediate packaging by providing a structure that allows direct placement of the photovoltaic cell on a back plate that will support pick and place manufacturing methods. This includes the ability to withstand a solder reflow operation at approximately 200° C.

While the present disclosure has been particularly shown and described with respect to preferred embodiments thereof, it will be understood by those skilled in the art that the foregoing and other changes in forms and details can be made without departing from the spirit and scope of the present disclosure. Each of the embodiments described herein can be implemented individually or in combination with any other embodiment unless expressly stated otherwise or clearly incompatible. It is therefore intended that the present disclosure not be limited to the exact forms and details described and illustrated, but fall within the scope of the appended claims.

What is claimed is:

1. A method of forming a photovoltaic structure, said method comprising:
    forming a stack, from bottom to top, of a conductive substrate and at least one electrical isolation layer;
    forming a patterned conductive material layer on said at least one electrical isolation layer, wherein said patterned conductive material layer comprises:
        at least one metallic wiring structure having a first thickness and contacting a top surface of said at least one electrical isolation layer, and
        at least one metallic receiver plate having a second thickness that is greater than said first thickness and contacting said top surface of said at least one electrical isolation layer; and
    mounting at least one photovoltaic element on said at least one metallic receiver plate.

2. The method of claim 1, wherein said forming of said patterned conductive material layer on said at least one electrical isolation layer comprises:
    depositing a lower conductive material layer;
    patterning said lower conductive material layer to form a patterned lower conductive material layer comprising said at least one metallic wiring structure and a lower portion of each of said at least one metallic receiver plate; and
    forming an upper conductive material layer comprising an upper portion of each of said at least one metallic receiver plate directly on said patterned lower conductive material layer.

3. The method of claim 2, wherein said upper conductive material layer comprises a same material as said lower conductive material layer.

4. The method of claim 2, wherein said upper conductive material layer comprises a different material than said lower conductive material layer.

5. The method of claim 2, wherein said patterning of said lower conductive material layer comprises forming one of said at least one metallic wiring structure and a lower portion of one of said at least one metallic receiver plate as a single contiguous structure.

6. The method of claim 2, wherein said forming of said upper conductive material layer comprises:
    forming a patterned masking layer over said at least one electrical isolation layer and a portion of said patterned lower conductive material layer; and
    plating said upper conductive material layer on physically exposed surface of said patterned lower conductive material layer.

7. The method of claim 6, wherein all surfaces of said at least one electrical isolation layer are physically masked during said plating of said upper conductive material layer.

8. The method of claim 1, wherein said forming of said patterned conductive material layer on said at least one electrical isolation layer comprises:
 forming a lower conductive material layer including said at least one metallic wiring structure and a lower portion of each of said at least one metallic receiver plate on said at least one electrical isolation layer; and
 transferring an upper conductive material layer including an upper portion of each of said at least one metallic receiver plate from a carrier substrate onto said lower conductive material layer.

9. The method of claim 8, wherein said transferring of said upper conductive material layer comprises:
 forming said upper conductive material layer on said carrier substrate;
 bonding said upper conductive material layer with said lower conductive material layer;
 cleaving said carrier substrate off said upper conductive material layer.

10. The method of claim 8, wherein said forming of said lower conductive material layer comprises forming one of said at least one metallic wiring structure and a lower portion of one of said at least one metallic receiver plate as a single contiguous structure.

11. The method of claim 1, wherein said forming of said patterned conductive material layer on said at least one electrical isolation layer comprises:
 forming a blanket conductive material layer on said at least one electrical isolation layer;
 patterning an upper portion of said blanket conductive material layer without physically exposing said at least one electrical isolation layer to form an upper portion of each of said at least one metallic receiver plate; and
 patterning a lower portion of said blanket conductive material layer to form said at least one metallic wiring structure.

12. The method of claim 11, wherein said upper portion of said blanket conductive material layer is patterned employing a first patterned photoresist layer as an etch mask, and said lower portion of said blanket conductive material layer is patterned employing a second patterned photoresist layer as an etch mask.

13. The method of claim 1, wherein said forming of said patterned conductive material layer comprises forming said at least one metallic receiver plate as a structure having a greater width than said at least one metallic wiring structure.

14. The method of claim 1, wherein said forming of said patterned conductive material layer comprises forming a metallic receiver plate among the at least one metallic receiver plate with a greater width than a metallic wiring structure among the at least one metallic wiring structure that is in lateral contact with the metallic receiver plate.

15. The method of claim 1, wherein upon mounting of said at least one photovoltaic element, for a photovoltaic element selected from the at least one photovoltaic element, a first metallic wiring structure among said at least one metallic wiring structure laterally contacts one of said at least one metallic receiver plate that underlies said photovoltaic element.

16. The method of claim 15, wherein said mounting of said at least one photovoltaic element comprises mounting said photovoltaic element within a region laterally bounded by a C-shaped portion of a second metallic wiring structure among said at least one metallic wiring structure.

17. The method of claim 1, wherein said mounting of said at least one photovoltaic element on said at least one metallic receiver plate comprises electrically shorting one node of each of said at least one photovoltaic element to one of said at least one metallic receiver plate.

18. The method of claim 17, wherein said mounting of said at least one photovoltaic element on said at least one metallic receiver plate further comprises electrically shorting another node of each of said at least one photovoltaic element to a metallic wiring structure among said at least one metallic wiring structure.

19. The method of claim 1, further comprising bonding a plurality of conductive wires to structures of a node of one of said at least one photovoltaic element at one end and to one of said at least one metallic wiring structure at another end.

20. The method of claim 1, wherein said forming of said at least one electrical isolation layer comprises depositing an inorganic dielectric material as one of said at least one electrical isolation layer.

21. The method of claim 1, wherein said forming of said at least one electrical isolation layer comprises depositing an organic dielectric material as one of said at least one electrical isolation layer.

22. The method of claim 1, wherein said forming of said at least one electrical isolation layer comprises depositing a dielectric metal oxide, a dielectric metal nitride, a dielectric metal oxynitride, or a combination thereof.

23. The method of claim 1, wherein said forming of said at least one electrical isolation layer comprises converting a surface portion of said conductive substrate into a dielectric oxide layer, wherein said at least one electrical isolation layer comprises at least said dielectric oxide layer.

24. The method of claim 23, wherein said conductive substrate comprises a metal, and said dielectric oxide layer is an electrically insulating metal-containing compound layer that includes an oxide of said metal.

25. The method of claim 24, wherein said metal is aluminum.

* * * * *